United States Patent
Fechner (10) Patent No.: US 9,773,808 B2
(45) Date of Patent: Sep. 26, 2017

(54) COMPACT SELF-ALIGNED IMPLANTATION TRANSISTOR EDGE RESISTOR FOR SRAM SEU MITIGATION

(71) Applicant: Honeywell International Inc., Morristown, NJ (US)

(72) Inventor: Paul S. Fechner, Plymouth, MN (US)

(73) Assignee: Honeywell International Inc., Morris Plains, NJ (US)

( * ) Notice: Subject to any disclaimer, the term of this patent is extended or adjusted under 35 U.S.C. 154(b) by 0 days.

(21) Appl. No.: 14/705,778

(22) Filed: May 6, 2015

(65) Prior Publication Data

US 2016/0329349 A1    Nov. 10, 2016

(51) Int. Cl.
| | | |
|---|---|---|
| *H01L 27/12* | (2006.01) | |
| *H01L 21/84* | (2006.01) | |
| *H01L 29/06* | (2006.01) | |
| *H01L 49/02* | (2006.01) | |
| *H01L 21/762* | (2006.01) | |

(Continued)

(52) U.S. Cl.
CPC .... *H01L 27/1203* (2013.01); *H01L 21/76267* (2013.01); *H01L 21/76283* (2013.01); *H01L 27/0738* (2013.01); *H01L 28/20* (2013.01); *H01L 29/0649* (2013.01); *H01L 29/1041* (2013.01); *H01L 29/66166* (2013.01); *H01L 27/0883* (2013.01)

(58) Field of Classification Search
CPC . H01L 27/1203; H01L 28/20; H01L 29/0649; H01L 29/66166; H01L 27/0738; H01L 21/76267; H01L 21/76283
See application file for complete search history.

(56) References Cited

U.S. PATENT DOCUMENTS

| | | |
|---|---|---|
| 4,212,683 A | 7/1980 | Jones et al. |
| 5,053,345 A | 10/1991 | Schnable et al. |

(Continued)

OTHER PUBLICATIONS

Liu et al., "The Effect of Active Delay Element Resistance on Limiting Heavy Ion SEU Upset Cross-Sections of SOI ADE/SRAMs," IEEE Transactions on Nuclear Science, vol. 54, No. 6, Dec. 2007, 8 pp.

(Continued)

*Primary Examiner* — Thomas L Dickey
*Assistant Examiner* — Damon Hillman
(74) *Attorney, Agent, or Firm* — Shumaker & Sieffert, P.A.

(57) ABSTRACT

This disclosure is directed to techniques for fabricating CMOS devices for SRAM cells with resistors formed along transistor well sidewall edges by self-aligned, angled implantation, which may enable more compact SRAM architecture with SEU mitigation, such as for space-based or other radiation-hardened applications. An example method includes implanting a dopant into a doped semiconductor well covered by a barrier, wherein the doped semiconductor well is disposed on a buried insulator and wherein the dopant is of opposite doping type to the doped semiconductor well, thereby forming a resistor on an edge of the doped semiconductor well, wherein the resistor has the opposite doping type. The method further includes forming a second insulator adjacent to the resistor, removing the barrier, and forming a gate layer on the doped semiconductor well, thereby forming a gate adjacent to the doped semiconductor well and the resistor.

20 Claims, 6 Drawing Sheets

(51) Int. Cl.
　　　*H01L 27/07*　　　(2006.01)
　　　*H01L 29/10*　　　(2006.01)
　　　*H01L 29/66*　　　(2006.01)
　　　H01L 27/088　　　(2006.01)

(56) References Cited

U.S. PATENT DOCUMENTS

| | | |
|---|---|---|
| 5,206,533 A | 4/1993 | Houston |
| 5,241,211 A | 8/1993 | Tashiro |
| 5,578,854 A | 11/1996 | Chen et al. |
| 5,631,863 A | 5/1997 | Fechner et al. |
| 5,665,629 A | 9/1997 | Chen et al. |
| 7,200,031 B2 | 4/2007 | Liu et al. |
| 7,375,000 B2 | 5/2008 | Nowak et al. |
| 7,486,541 B2 | 2/2009 | Liaw |
| 7,732,287 B2 | 6/2010 | Fechner et al. |
| 7,965,540 B2 | 6/2011 | Cannon et al. |
| 2008/0096342 A1* | 4/2008 | Sheraw ............... H01L 27/0629 438/210 |
| 2010/0117153 A1* | 5/2010 | Lucking ............ H01L 29/66772 257/351 |
| 2011/0207281 A1 | 8/2011 | Kamoshita |

OTHER PUBLICATIONS

Extended Search Report from counterpart European Application No. 16166509.6, dated Oct. 6, 2016, 8 pp.

Response to Extended European Search Report and Opinion pursuant to Rule 62 EPC, dated Oct. 6, 2016, from counterpart European Application No. 16166509.6, filed on Apr. 23, 2017, 14 pp.

* cited by examiner

COMPACT SELF-ALIGNED IMPLANTATION TRANSISTOR EDGE RESISTOR FOR SRAM SEU MITIGATION

This disclosure relates to complementary metal-oxide-semiconductor (CMOS) integrated circuits, and more particularly, to CMOS integrated circuit electronic circuits fabricated in a partially depleted silicon on insulator (SOI) process.

BACKGROUND

Some CMOS integrated circuits may be made in a partially depleted silicon on insulator (SOI) process. Certain applications such as electronics for satellites, upper rocket stages, space probes, spaceships, and other applications with radiation-hardened requirements impose special demands such as single event upset (SEU) mitigation, or mitigating electronic state upsets by single radiation-induced events, that are not met by circuit architecture for ordinary consumer electronics. SEU in space is caused by energetic particles traversing circuit nodes and depositing charge sufficient to disrupt operation.

Space applications typically call for random access memory (RAM) with high performance and low power requirements, as well as protection against radiation effects. Radiation can cause many undesirable effects in circuit operation. For example, radiation can change the conductance of MOS transistors by changing the threshold voltage (Vt). Ir space, heavy particles from a single cosmic ray are capable of depositing relatively large amounts of deposited charge on a circuit node. There is a direct relationship between the radiation induced upset rate requirements and the performance requirement of radiation hardened static random access memory (SRAM). Radiation can also generate significant levels of transient voltage and current disturbances on internal nodes, including power and ground.

These internal disturbances can slow circuit performance or even upset circuit operation, e.g., changing the state of a memory cell. For a given node within a memory cell, there exists an amount of deposited charge which the driving transistor and the nodal capacitance cannot absorb without failing to maintain the node in the desired state. Therefore, the radiation induced charge can result in a change in the stored data state. Some specialized circuit architecture technologies have used designs such as back-ta-back reverse-biased Schottky resistors as compact high value resistors with an active delay element (ADE) in SRAM cells.

SUMMARY

This disclosure is directed to techniques, methods, and systems for fabricating SRAM cells with resistors formed along the sidewall edges of transistors (e.g., ADE transistors) by self-aligned, angled implantation, which may enable more compact SRAM architecture with SEU mitigation. The implantation is done prior to removal of a Shallow Trench Isolation (STI) barrier such as nitride, enabling the implantation to be self-aligned to the sidewall edge of the silicon island. The height of the silicon islands may determine the width of the implantation. The length of the implantation may be controlled by the gate dimension which may be the most highly controlled dimension in a CMOS process. The depth of the implantation may be controlled by implant variables which may also be highly controlled in a CMOS process. A self-aligned transistor sidewall edge resistor of this disclosure may thus be precisely formed with very compact size, very high resistance (e.g., approximately 100,000 to over a million ohms), and nominal read-write margin. A self-aligned transistor sidewall edge resistor of this disclosure may thus enable a small circuit architecture with reduction or prevention of SEU suitable for specialized applications such as space-based assets, and across a large temperature range and with low supply voltage.

In one example, a complementary metal-oxide semiconductor (CMOS) device includes a first semiconductor well disposed on a first insulator, the first semiconductor well having a first doping type. The CMOS device further includes a second insulator disposed in the first semiconductor well. The CMOS device further includes agate disposed on the first semiconductor well. The CMOS device further includes a resistor disposed on an edge of the first doped semiconductor well, adjacent to the second insulator and in contact with the gate, the resistor having a second doping type opposite the first doping type.

In another example, a method includes implanting a dopant into a doped semiconductor well covered by a barrier, wherein the doped semiconductor well is disposed on a buried insulator and wherein the dopant is of opposite doping type to the doped semiconductor well, thereby forming a resistor on an edge of the doped semiconductor well, wherein the resistor has the opposite doping type. The method further includes forming a second insulator adjacent to the resistor, removing the barrier, and forming a gate layer on the doped semiconductor well, thereby forming a gate adjacent to the doped semiconductor well and the resistor.

The details of one or more examples are set forth in the accompanying drawings and the description below. Other features, objects, and advantages will be apparent from the description and drawings, and from the claims.

DETAILED DESCRIPTION

Various examples are described below directed to techniques, methods, systems, and devices for fabricating SRAM cells with resistors formed along the sidewall edges of transistors (e.g., ADE transistors) by self-aligned, angled implantation. A self-aligned SRAM cell sidewall edge resistor ("self-aligned edge resistor") as described herein may minimize effects of turning the transistor off on the resistor value, while enabling the resistance to increase proportionally to source-to-drain bias. In addition, the gate to source/drain capacitance may be reduced by a factor of two or more relative to typical SRAM cells using Schottky elements, since the extra capacitance associated with the gate next to the Schottky elements is eliminated. The dimensions of the self-aligned edge resistor may be controlled by the thickness of the starting top silicon layer on the SOI substrate and the gate masking step, which may be the most highly controlled dimensions in an SOI CMOS process, resulting in the ability to control the resistor value to a high degree of precision relative to previous techniques. The improvement in both control and temperature stability enabled by the self-aligned edge resistor may be sufficient to avoid a requirement to turn on the transistor during the read/write cycle, as is typical in previous techniques, thus further minimizing circuit design complexity.

A self-aligned edge resistor as described herein may be compatible with the minimum-sized transistor available in the technology, and may be compatible with either a p-channel or n-channel transistor, permitting optimization for SRAM cell size. For example, a p-channel option (a p-type edge implant in an n-type well) for implementing a self-aligned edge resistor may maximize usable resistance for a given doping level due to approximately three times lower mobility and may balance n-well and p-well area to maximize density.

The high degree of control for the dimensions of the self-aligned edge resistor may be an advantage over other planar resistor solutions, and the use of an SOI silicon process may provide improved control and temperature effects over polysilicon processes. A self-aligned edge resistor may increase resistance with source-to-drain bias which may enable excellent resistor characteristics even when the transistor part is turned off. A self-aligned edge resistor may also scale down with successively smaller technology generations, and may directly enable smaller SRAM area using smaller values of active power. A self-aligned edge resistor may also enable advantageous implementations in any application requiring a compact resistor with high-precision, high resistance value, including in analog circuits.

Figure 1:
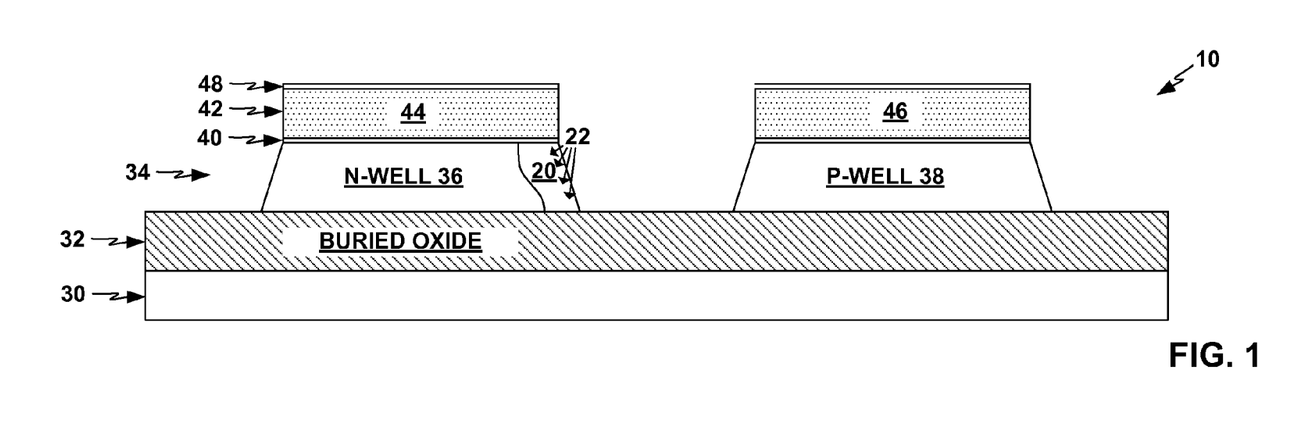
FIG. 1 shows a lateral cross-section view of a CMOS device including a self-aligned edge resistor in mid-fabrication in a Shallow Trench isolation (STI) partially depleted silicon on insulator (SOI) process, in one example.

FIG. 1 shows a lateral cross-section view of a CMOS device 10A including a self-aligned edge resistor 20 in mid-fabrication in a Shallow Trench Isolation (STI) partially depleted silicon on insulator (SOI) process, in one example, CMOS device 10A may be in a fabrication state as shown in FIG. 1 after initial process functions performed on an STI stack that includes a bulk silicon substrate 30, a buried oxide layer 32 or other type of buried insulator layer (e.g., a buried oxide layer of silicon dioxide) disposed on top of bulk silicon substrate 30, a silicon device layer 34 disposed on top of the buried oxide layer 32, a pad oxide layer 40 disposed on top of the silicon device layer 34, an STI nitride barrier layer 42 disposed on top of the pad oxide layer 40, and a top oxide layer 48 disposed on top of the STI nitride barrier layer 42.

As shown in FIG. 1, the layers 30-48 of CMOS device 10A have been modified in CMOS STI process steps of patterning, etching, and initial doping, to eliminate portions of silicon device layer 34, pad oxide layer 40, STI nitride barrier layer 42, and top oxide layer 48 to create two silicon islands with first and second semiconductor wells, an n-type well 36 ("n-well 36") and a p-type well 38 ("p-well 38") topped with STI nitride barrier blocks 44, 46 respectively. The patterning and etching steps may include placement of a patterned photoresist mask over CMOS device 10A; etching via sputter, plasma, reactive-ion, or other etching technique; and stripping of the photoresist. N-well 36 may be doped with an n-type dopant (e.g., phosphorus) that donates electrons to surrounding silicon, and p-well 38 may be doped with a p-type dopant (e.g., boron) that donates electron holes to (i.e., that accepts electrons from) surrounding silicon. P-well 38 thus has opposite doping as N-well 36. CMOS device 10A as shown in FIG. 1 may provide electrical isolation between n-well 36 and p-well 38.

In CMOS device 10A as shown in FIG. 1, a p-type dopant 22 (e.g., boron) is also implanted via a self-aligned, angled implantation into a compact internal sidewall edge area of n-well 36, resulting in a self-aligned edge resistor 20 along the compact internal sidewall edge area of n-well 36. The p-type dopant 22 of self-aligned edge resistor 20 inverts the doping of n-well 36 within the volume of self-aligned edge resistor 20. The implantation of p-type dopant 22 is self-aligned and angled around the implantation shadow of STI nitride barrier block 44. P-type dopant 22 may be implanted past and around the bulk of STI nitride barrier block 44 or other barrier, which prevents implantation of p-type dopant into the central body of n-well 36. Self-aligned edge resistor 20 is thus self-aligned along a compact, precisely controlled volume of the sidewall edge of n-well 36.

In other examples, any type of barrier layer may be used in place of STI nitride barrier layer 42 or STI nitride barrier block 44, and dopant ions may be implanted into the sidewall edge area of n-well 36 past the barrier shadow of the barrier layer. Depending on the dopant implant technique, the p-type dopant 22 may also be incidentally implanted in the sidewall edge of p-well 38, though in this case, the p-type dopant will superimpose on the same p-type doping type as p-well 38 and not create an edge resistor in p-well 38.

Figure 2:
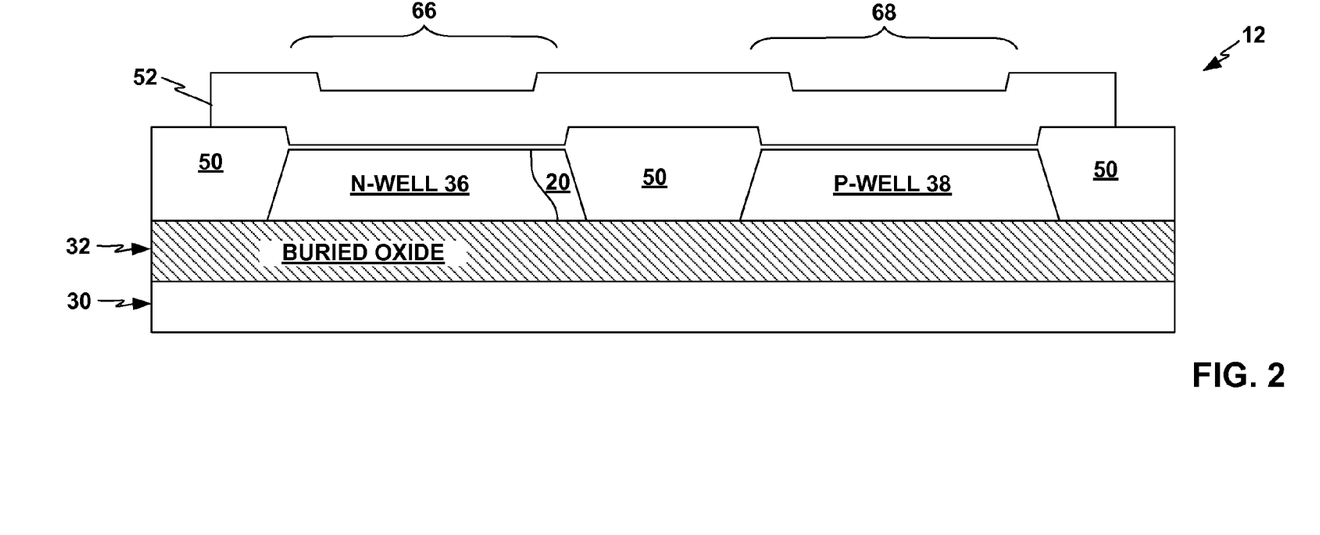
FIG. 2 shows a lateral cross-section view of a CMOS device corresponding to the CMOS device shown in FIG. 1 after additional process steps to deposit an STI oxide layer, to planarize the STI oxide layer, to remove the STI nitride barrier layer, and to deposit a device gate layer, in one example.

FIG. 2 shows a lateral cross-section view of a CMOS device 10B, corresponding to CMOS device 10A shown in FIG. 1 after additional process steps to deposit or otherwise form a Shallow Trench Isolation (STI) oxide layer 50 or other type of STI insulator layer, to planarize (chemically mechanically polish) STI oxide layer 50, to remove STI nitride barrier layer 42 (including STI nitride barrier blocks 44, 46), and to form a device gate layer 52, in one example, CMOS device 10B may thus include a transistor gate in device gate layer 52 over n-well 36 and p-well 38 with a self-aligned edge resistor 20 in the n-well 36. Device gate layer 52 may be formed by being deposited or thermally grown, in various examples. Self-aligned edge resistor 20 may thus connect a source and a drain (not shown in FIG. 2) self-aligned to device gate layer 52, in which the source and drain may also be n-type, as further described below. Self-aligned edge resistor 20 with p-type doping may thus enable the resistance between the source and drain to increase proportionally to source-to-drain bias.

Buried oxide layer 32 and STI oxide layer 50 may thus electrically insulate and isolate n-well 36 and p-well 38 from each other and from other CMOS devices (not shown in FIG. 1) formed in the device layer 34, such as other similar n-well and p-well pairs. In other examples, a CMOS device may be formed with an n-type self-aligned edge resistor along a silicon island sidewall edge in p-well 38. The process step of removing STI nitride barrier layer 42 (or other barrier layer) may include using a hot phosphoric strip, for example.

In some examples, p-type dopant 22 may be deposited via an ion implantation process. In various examples, "implanting" may include any process for embedding, integrating, or depositing p-type dopant 22 into n-well 36. In some examples, p-type dopant 22 may be deposited into the sidewall edge of n-well 36 to form self-aligned edge resistor 20 in multiple implant steps with repositioning of a wafer hosting CMOS device 10A/10B (collectively "CMOS device 10") between each implant step. For example, p-type dopant 22 may be divided into four equally divided portions to be implanted in four steps, and the wafer may be rotated 90 degrees between each implant step, a process known as quad mode implantation. Although this disclosure presents an STI SOI process to create a self-aligned edge resistor, a self-aligned edge resistor may be created using other types of isolation schemes or patterning and etching steps in other example processes.

Thus, the height of the silicon islands formed by n-well 36 and p-well 38 may determine the width of the implantation of p-type dopant 22 in forming self-aligned edge resistor 20. The length of the implantation of p-type dopant 22 to form self-aligned edge resistor 20 may be controlled by the gate dimension which may be the most highly controlled dimension in a CMOS process. The depth of the implantation of p-type dopant 22 to form self-aligned edge resistor 20 may be controlled by implant variables which may also be highly controlled in a CMOS process. Self-aligned edge resistor 20 may thus be precisely formed with very compact size, very high resistance (e.g., approximately 100,000 to over a million ohms), and nominal read-write margin. Self-aligned edge resistor 20 may thus enable a small circuit architecture with reduction or prevention of SEU suitable for specialized applications such as space-based assets, and across a large temperature range and with low supply voltage.

Figure 3:
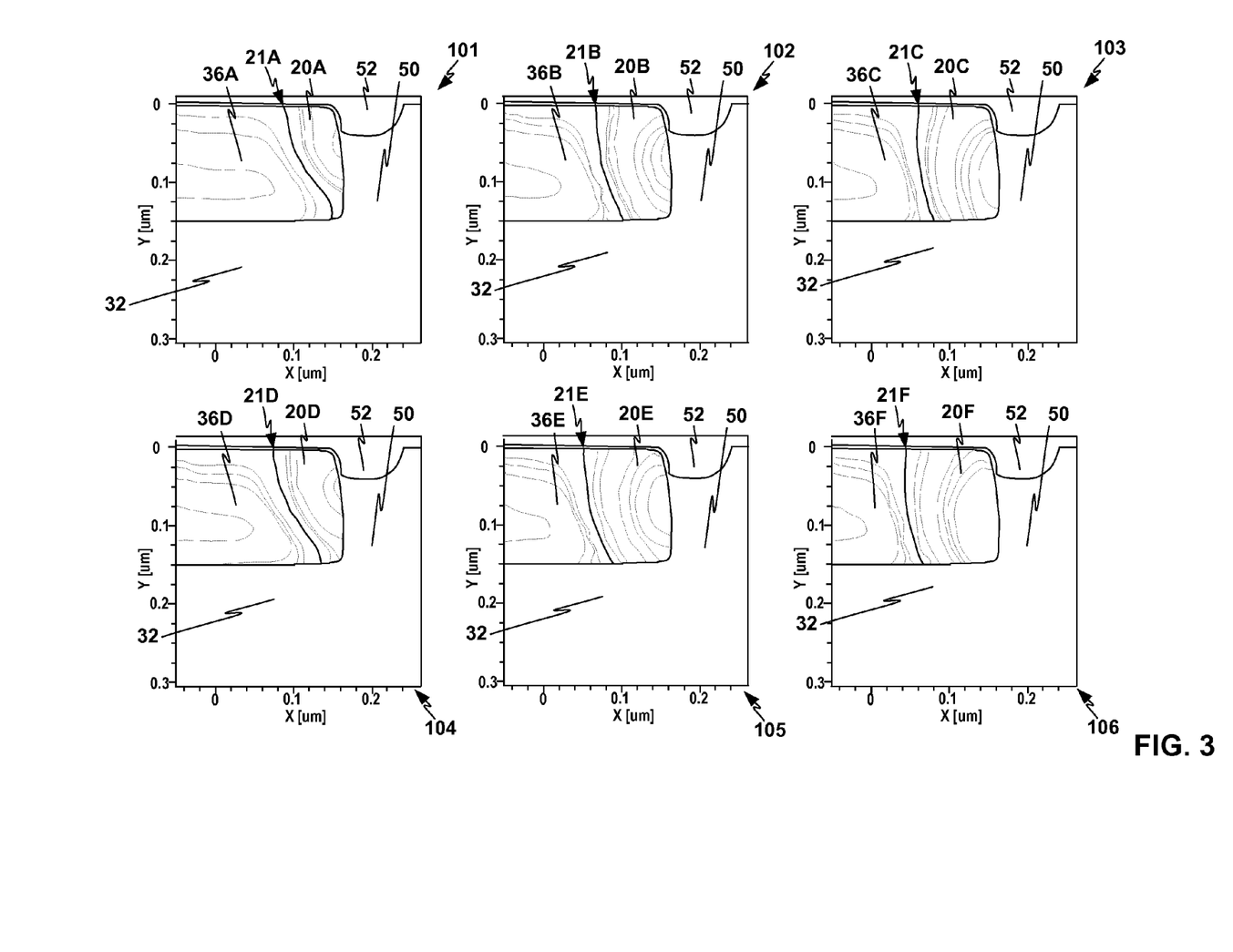
FIG. 3 shows lateral cross-section views of various examples of CMOS devices with respective self-aligned edge resistors implanted with different implant characteristics, in accordance with example two-dimensional simulations.

FIG. 3 shows lateral cross-section views of section views of various examples of CMOS devices 101, 102, 103, 104, 105, 106 ("CMOS devices 101-106") with respective self-aligned edge resistors 20A, 20B, 20C, 20D, 20E, 20F (collectively, "self-aligned edge resistors 20") implanted with different implant characteristics, in accordance with example two-dimensional simulations. CMOS devices 101-106 also have respective n-wells 36A, 36B, 36C, 36D, 36E, 36F (collectively, "n-wells 36") separated from respective self-aligned edge resistors 20A, 20B, 20C, 20D, 20E, 20F by respective inversion boundaries 21A, 21B, 21C, 21D, 21E, 21F. FIG. 3 shows sections of each of CMOS devices 101-106 with n-well 36 and self-aligned edge resistor 20 isolated by buried oxide layer 32 and STI oxide layer 50, and with gate layer 52 disposed above. Each of the six section views in FIG. 3 is a cross-sectional view of half of a gate, with a perspective in a direction between the source and the drain. In each case, self-aligned edge resistor 20 may be considered separate from the surrounding n-well 36 along a metallurgical junction where the n-type doping concentration of a-well 36 and the p-type doping concentration of self-aligned edge resistor 20 are balanced.

FIG. 3 further shows how the different implant variables, in particular, implantation energies and doses in the examples of FIG. 3, may determine the size, form, and doping concentration of the self-aligned edge resistors 20 in process simulations. In particular, CMOS device 102 shows a self-aligned edge resistor 20B with a higher implantation energy than self-aligned edge resistor 20A of CMOS device 101, and CMOS device 103 shows a self-aligned edge resistor 20C with a higher implantation energy than self-aligned edge resistor 20B of CMOS device 102. In the particular examples shown, CMOS devices 101-103 show implantation energies of 20, 35, and 50 kilo-electronvolts (keV), respectively. In other examples, the energy of implantation may be 10 keV or lower, or 100 keV or higher, depending on specific characteristics of a particular CMOS device, to enable sufficient current to flow through self-aligned edge resistor 20B for it to function as a transistor sidewall edge resistor.

The resistance of self-aligned edge resistor 20B may thus form a conductive path between the source and the drain through a gate formed by CMOS device 102. The resistance of self-aligned edge resistor 20B may be sufficient to enable a current of a selected value to flow through the resistor when a gate bias of the gate is turned on, and a current of a lower value to flow through the resistor when the gate bias of the gate is turned off. The dopant may be implanted at a selected implantation dosage and a selected energy of implantation to provide the resistance sufficient to enable the current to flow through the resistor in this way.

CMOS devices 104-106 show the same implantation energies as CMOS devices 101-103, respectively, but with a higher implantation dosage. In particular, CMOS devices 101-103 are all shown with an implantation dosage of $3\times10^{14}$ ions per square centimeter, while CMOS devices 104-106 are all shown with an implantation dosage of $5\times10^{14}$ ions per square centimeter. In other examples, the selected implantation dosage may be $1\times10^{14}$ ions per square centimeter or lower, or $1\times10^{15}$ ions per square centimeter or higher, depending on the characteristics of the specific CMOS device to enable sufficient current to flow through self-aligned edge resistor 20B. The resistance value of self-aligned edge resistor 20 may be determined by the characteristics of the implant, such that the higher the implant dose, the lower the resistance.

Figure 4:
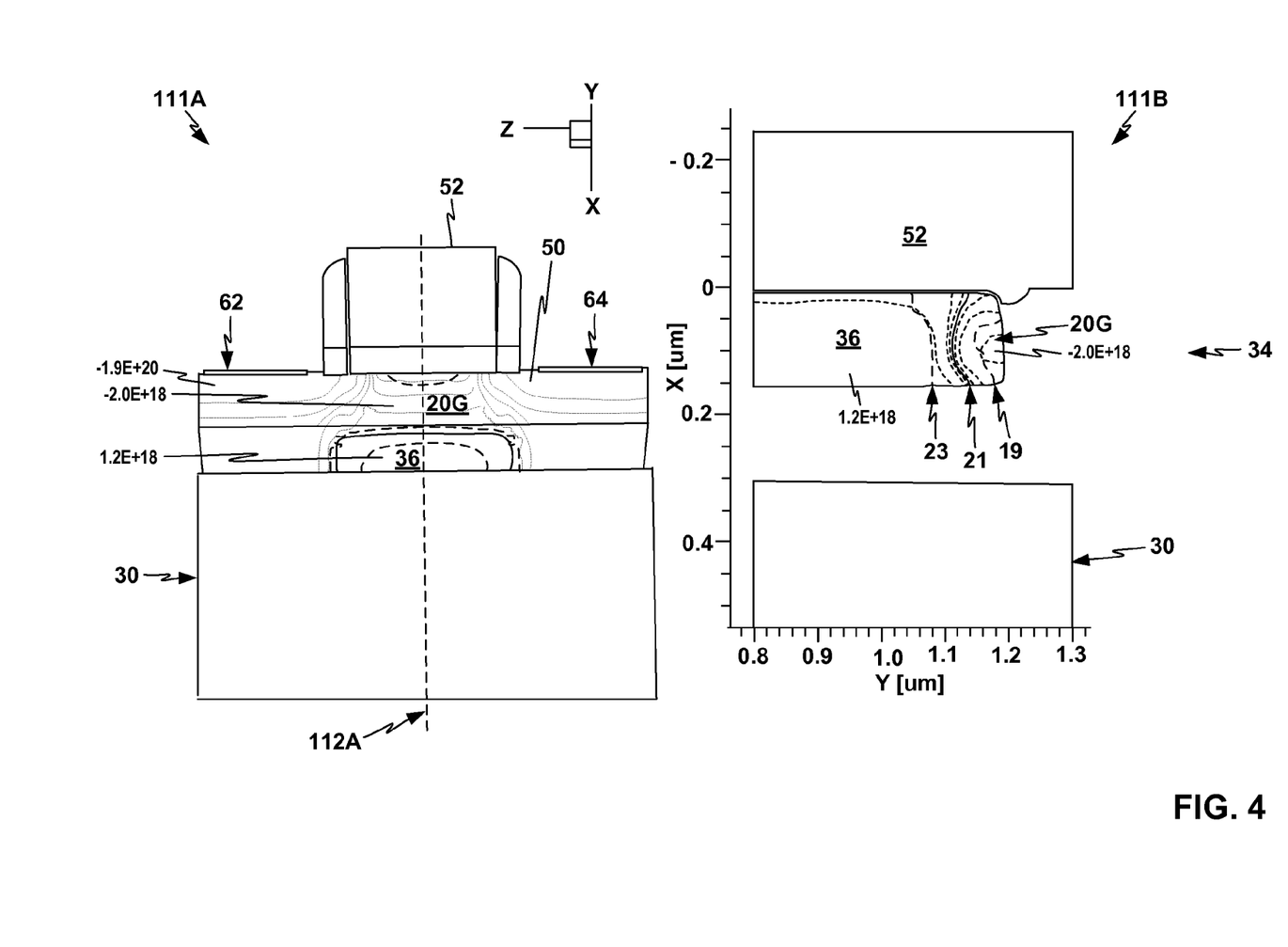
FIG. 4 shows an angled longitudinal/azimuthal cross-section view and lateral cross-section views of another example CMOS device with a self-aligned edge resistor in an example three-dimensional simulation.

FIG. 4 shows an angled longitudinal/azimuthal cross-section view and cross-sectional views of another example CMOS device, labeled 111A in an angled longitudinal/azimuthal cross-section view (perpendicular to the views of FIGS. 1-3), and 111B in a lateral (as in FIGS. 1-3) cross-section view, respectively (collectively, "CMOS device 111"), with a self-aligned edge resistor 200 in an example three-dimensional simulation. View 111B is a lateral cross-section along vertical reference line 112A in view 111A. View 111A shows a lateral distribution of self-aligned edge resistor 200 relative to n-well 36, in one example. Self-aligned edge resistor 20G forms a p-type channel with a width of 0.34 micrometers (microns) in this example (and may have a larger or smaller width in other examples). Views 111A and 111B both indicate doping concentrations with dashed lines in approximately half-order of magnitude boundaries, such as from $-2.0*10^{18}$ at right to $+1.2*10^{18}$ at left in view 111B. CMOS device 111 in longitudinal/azimuthal view 111A shows a cross-section of an n-well 36 proximate an edge thereof and proximate the junction with self-aligned edge resistor 200. CMOS device in perspective view 111A also shows STI oxide layer 50, and source and drain implants 62 and 64, respectively, on the top of the CMOS device, on either side of gate layer 52; and bulk silicon substrate 30.

View 111B of CMOS device 111 shows lateral distribution of self-aligned edge resistor 200 relative to n-well 36 in silicon device layer 34, with gate layer 52, disposed above silicon device layer 34. View 111B also shows depletion region boundaries 19 and 23 within self-aligned edge resistor 200 and n-well 36, respectively, on either side of the inversion boundary 21 that defines the boundary between p-type self-aligned edge resistor 200 and n-well 36. Depletion region boundaries 19 and 23 as shown in view 111B are the edges of a depletion region between the n-type material in n-well 36 and the p-type material in self-aligned edge resistor 20G when a drain voltage $V_d$ of drain implant 64 and source voltage $V_s$ of source implant 62 are applied at −1.95 volts, and body voltage $V_{body}$ and gate voltage $V_{gate}$ are zero. The major part of the resistance of self-aligned edge resistor 20G in this example is due to the core part of self-aligned edge resistor 20G to the right of depletion region boundary 19 as shown in view 111B, which has a significantly higher ratio of p-type to n-type doping than within the depletion region portion of self-aligned edge resistor 20G between depletion region boundary 19 and inversion boundary 21.

Figure 5:
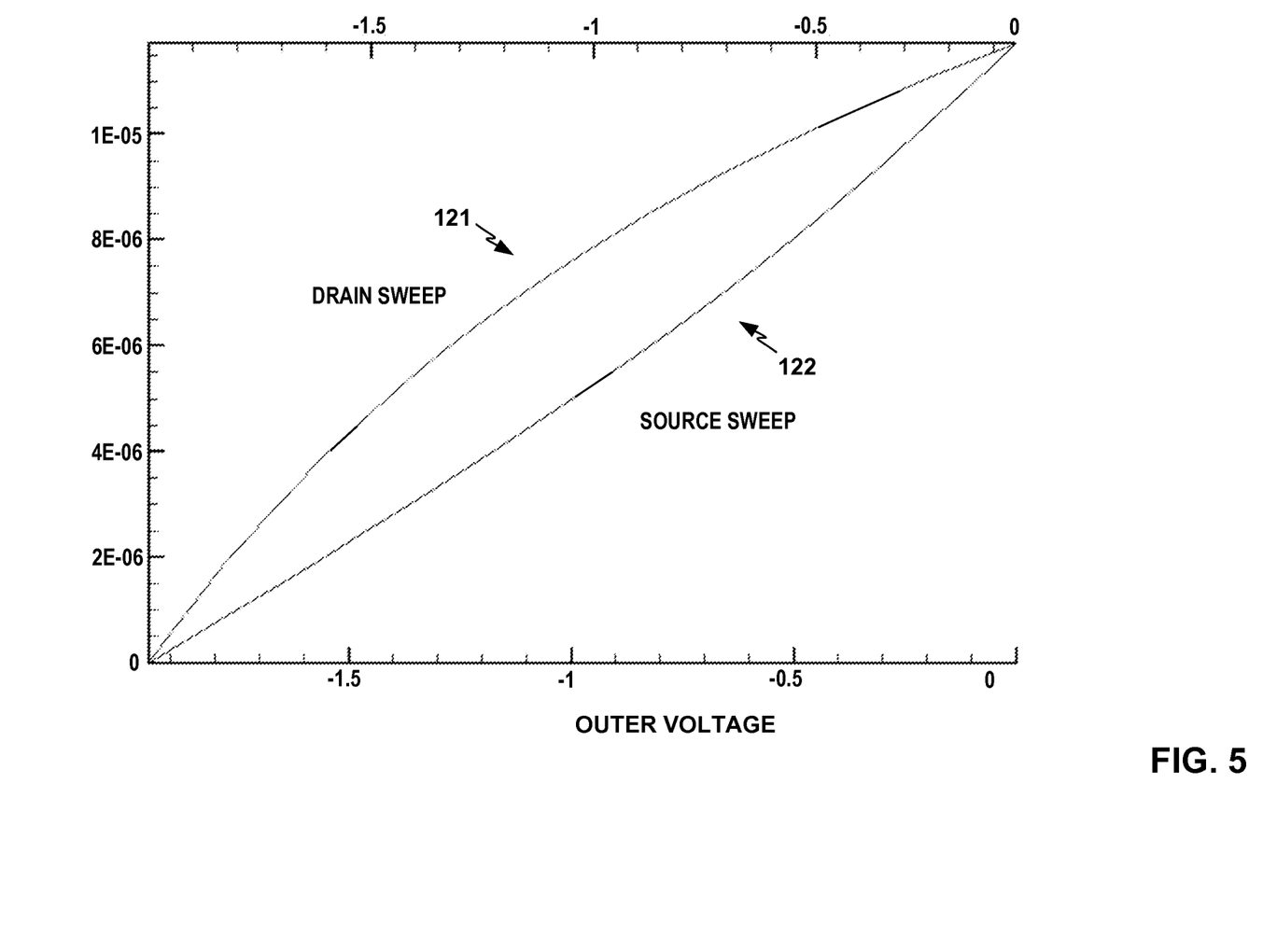
FIG. 5 shows a graph of source to drain conductivity characteristics of the self-aligned edge resistor of FIG. 4 in a drain voltage sweep followed by a source voltage sweep, via a drain implant and source implant on opposing sides of the transistor gate as shown in the angled longitudinal/azimuthal cross-section view in FIG. 4, in one example.

FIG. 5 shows a graph of source to drain conductivity characteristics of self-aligned edge resistor 20G of FIG. 4 in a drain voltage sweep followed by a source voltage sweep, via drain implant 64 and source implant 62 on opposing sides of the transistor gate as shown in the angled longitudinal/azimuthal cross-section view 111A in FIG. 4, in one example. The left y axis in FIG. 5 shows current from zero to 12 microamps, the lower x axis shows the source voltage from −1.95 to 0 volts going from left to right, and the upper x axis shows the drain voltage from −1.95 to 0 volts going from right to left. Arc 121 shows a drain voltage sweep as drain voltage goes from 0 to −1.95 and current rises from 0 to 12 microamps, and arc 122 shows a subsequent source voltage sweep as source voltage goes from 0 to −1.95 and current drops back from 12 microamps to 0, while body voltage and gate voltage are 0.

The graph of FIG. 5 shows that self-aligned edge resistor 20G remains conductive under all conditions, and that the source-drain voltage induces a sufficient depletion region to enable conduction through self-aligned edge resistor 20G. As CMOS device 111 is turned on and off, it can be driven into effective deep depletion equivalent to having a body tie bias on the device. CMOS device 111 is prevented from being turned off if a gate bias voltage or a body bias voltage appears. The effective resistance of self-aligned edge resistor 20G may vary proportionally to the source-to-drain bias voltage, and may be approximately in the range of 100,000 to ten million ohms. The effective resistance of self-aligned edge resistor 20G when drain-to-source bias voltage is near 0 may vary from about 90,000 to 200,000 ohms as a function of body bias, in this example, 200,000 ohms may occur in a worst case transient resistance in this example when the transistor is turned off and the body goes into deep depletion. In another example, the drain and source voltage may go to −1.2 volts instead of −1.95, and the worst case transient resistance effects may be smaller.

Figure 6:
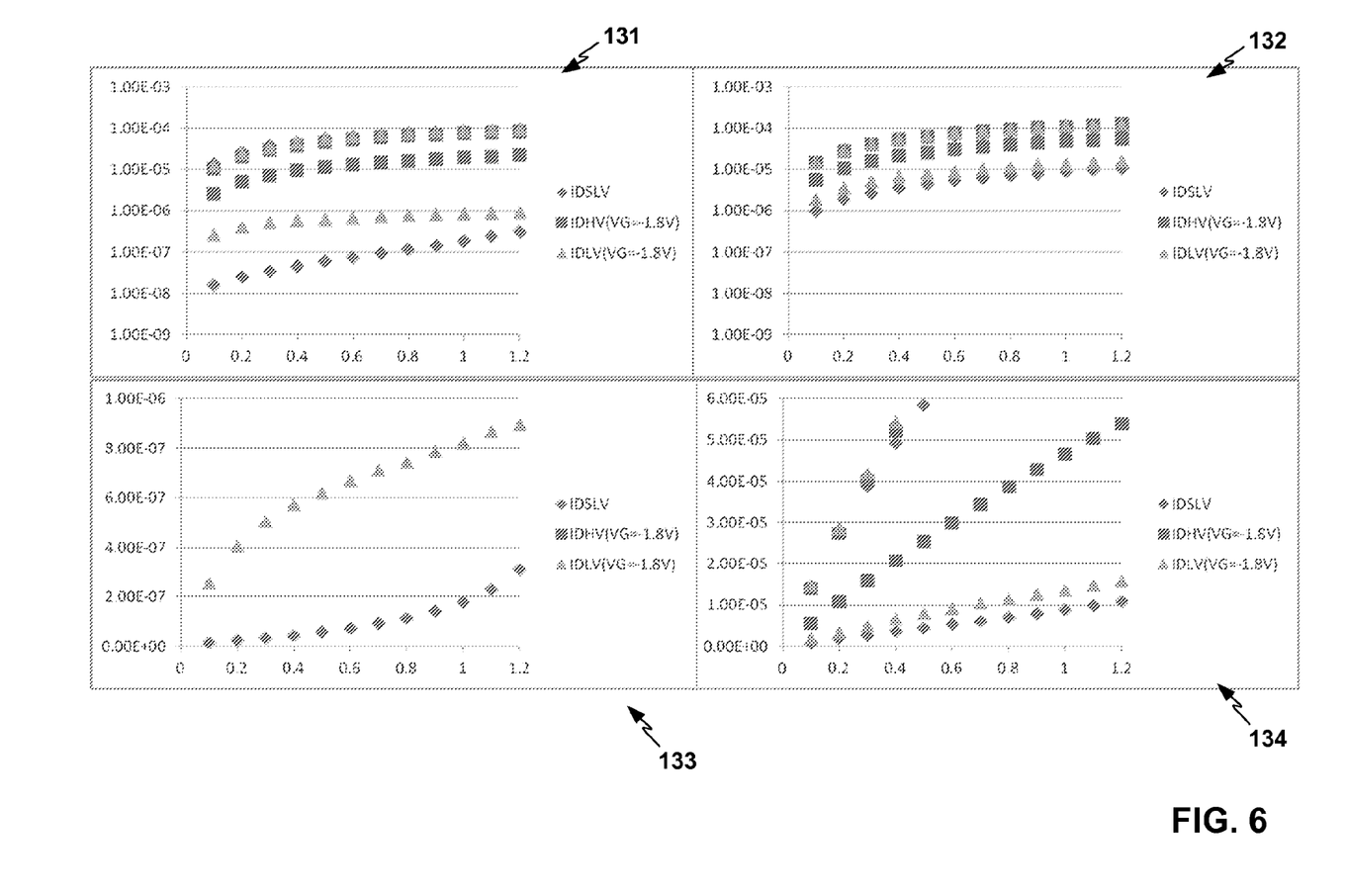
FIG. 6 shows graphs of examples of current flowing through a self-aligned edge resistor as a function of drain voltage in on and off gate bias conditions in three different example CMOS devices, in accordance with experimental results of measurements in example physical implementations of CMOS devices.

FIG. 6 shows graphs 131, 132, 133, 134 of examples of current flowing through self-aligned edge resistor 20G as a function of drain voltage $V_{drain}$ in on and off gate bias conditions in three different example CMOS devices, in accordance with experimental results of measurements in example physical implementations of CMOS devices. Graphs 131 and 133 show current over voltage, in logarithmic and direct scales, respectively, in each of the three CMOS devices with a doping implantation density of $3 \times 10^{14}$ ions per square centimeter, and graphs 132 and 134 show current over voltage, also in logarithmic and direct scales, respectively, in each of the three CMOS devices with a doping implantation density of $5 \times 10^{14}$ ions per square centimeter. Graphs 131-134 all show current in microamps through self-aligned edge resistor 200 along the y axis, and applied drain voltage in volts along the x axis. Graphs 131 and 132 are in a logarithmic scale, while graphs 133 and 134 show a detailed section of interest of graphs 131 and 132, respectively, in a linear scale.

The three different CMOS devices are a high voltage (HV), low voltage (LV), and super low voltage (SLV) versions, and the drain voltage $V_{drain}$ each case rises from 0 to 1.2 volts. The HV version CMOS device may have a 3.3 volt transistor, the LV version CMOS device may have a 1.8 volt transistor, and the SLV version CMOS device may have a 1.2 volt transistor, in these examples.

In each example, self-aligned edge resistor 20G has a p-type channel with a width of 0.34 microns, as in the example of FIGS. 4 and 5 as described above. The current through self-aligned edge resistor 20G varies as voltage over resistance of self-aligned edge resistor 20G, where resistance varies proportionally to drain voltage, and is a function of the halo implantation dose of n-well 36 and the edge implantation dose of self-aligned edge resistor 20G, as shown in FIG. 4. Self-aligned edge resistor 200 may achieve a resistance in the range of approximately 100,000 to one million ohms, in these examples. Self-aligned edge resistor 20G may have a p-type doping implantation level tuned to a specified resistance with respect to the voltage of the particular version of the CMOS device, with a relatively low doping level and relatively high resistance for the SLV version, a higher doping level and lower resistance for the LV version, and a still higher doping level and still lower resistance for the HV version. The implantation level of self-aligned edge resistor 200 may thus be adjusted relative to the voltage of the CMOS device version to target a specified resistance over the applicable voltage range. While this example is discussed in terms of forming self-aligned edge resistor 20G with a p-type dopant implanted into the sidewall edge of an n-type well, other examples may be implemented with a self-aligned edge resistor formed of an n-type doping implantation into an edge of a p-type well.

In graphs 131-134, the higher values of current occur in the drain voltage condition, when the drain voltage in the CMOS device is applied or turned on. In this condition, the current shorts out self-aligned edge resistor 20G. When the drain voltage is turned off, the resistance remains, and at a high value. Self-aligned edge resistor 20G thus enables voltage still to be applied to the body of the CMOS device when the drain voltage of the CMOS device is turned off. Self-aligned edge resistor 20G may thus also prevent floating body effects in the CMOS device and mitigate the risk of an SEU in an SRAM cell that includes the CMOS device.

Figure 7:
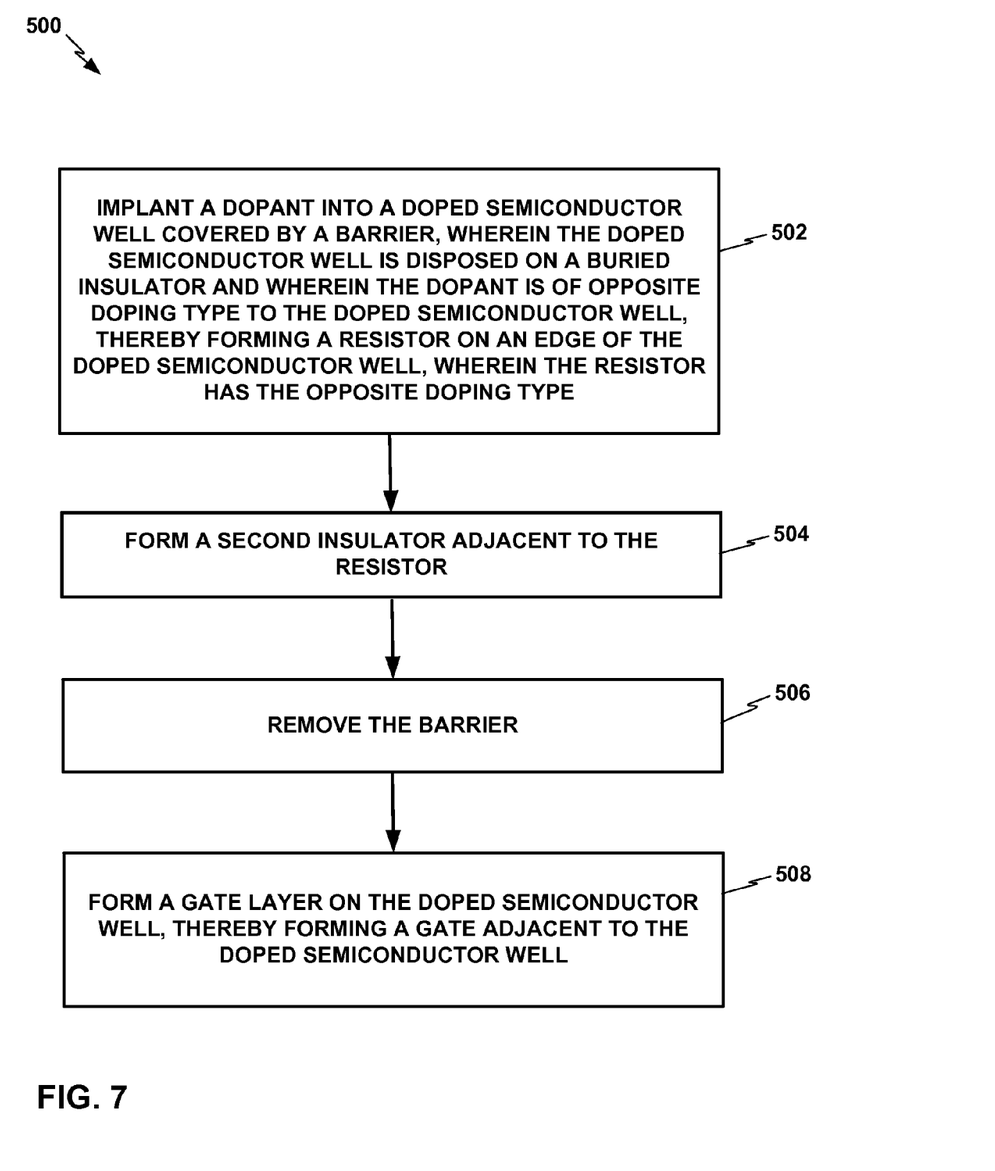
FIG. 7 depicts a flowchart for an example process for forming a CMOS device with a self-aligned edge resistor, in accordance with illustrative aspects of this disclosure.

FIG. 7 depicts a flowchart for an example process 500 for forming a CMOS device with a self-aligned edge resistor, in accordance with illustrative aspects of this disclosure. In this example, process 500 includes implanting a dopant into a doped semiconductor well covered by a barrier, wherein the doped semiconductor well is disposed on a buried insulator and wherein the dopant is of opposite doping type to the doped semiconductor well, thereby forming a resistor on an edge of the doped semiconductor well, wherein the resistor has the opposite doping type (e.g., implanting a p-type dopant 22 such as boron into a sidewall edge of n-type doped semiconductor well 36 covered by the barrier of STI nitride barrier block 44 of STI nitride barrier layer 42 to form self-aligned edge resistor 20, wherein n-well 36 is disposed on the insulator of buried oxide layer 32, and wherein p-type dopant 22, is of opposite doping type to n-type well 36, as described above) (502). Process 500 further includes forming a second insulator adjacent to the resistor (e.g., depositing an STI oxide layer 50 over CMOS device 10, including adjacent to self-aligned edge resistor 20) (504). Process 500 further includes removing the barrier (e.g., removing STI nitride barrier block 44) (506). Process 500 further includes forming agate layer on the doped semiconductor well, thereby forming a gate adjacent to the doped semiconductor well and the resistor (e.g., depositing or thermally growing gate layer 52 on CMOS device 10 including n-well 36) (508).

Although various example methods are described above with reference to an STI scheme in an SOI process, other examples may be carried out at other points of an SOI process. A self-aligned edge resistor as described herein may be particularly advantageous in radiation hardened circuits, in some examples. Such circuits may use a self-aligned edge resistor as described herein to mitigate ion induced glitching, state changes, or other failure modes. However, it is also contemplated that a self-aligned edge resistor as described herein may also be used where appropriate in various other applications not involving radiation hardened requirements. The term "deposited" may generically refer to Chemical Vapor Deposition (CVD), plasma enhanced CVD, and other methods of fabricating dielectric or other semiconductor related films.

Various aspects of the disclosure have been described. These and other aspects are within the scope of the following claims.

What is claimed is:

1. A complementary metal-oxide semiconductor (CMOS) device comprising:
   a first semiconductor well disposed on a first insulator, the first semiconductor well having a first doping type;
   a second insulator disposed on the first semiconductor well;
   a gate disposed on the first semiconductor well; and
   a resistor disposed on an edge of the first semiconductor well, adjacent to the second insulator and in contact with the gate, the resistor having a second doping type opposite the first doping type,
   wherein the resistor enables a current to flow through a source and a drain of the CMOS device through the resistor.

2. The CMOS device of claim 1, wherein the resistor is implanted in the edge of the first doped semiconductor well.

3. The CMOS device of claim 1, wherein the first doping type is doped with an n-type dopant, and the opposing second doping type is doped with a p-type dopant.

4. The CMOS device of claim 3, wherein the n-type dopant is phosphorus, and the p-type dopant is boron.

5. The CMOS device of claim 1, wherein the first doping type is doped with a p-type dopant, and the opposing second doping type is doped with an n-type dopant.

6. The CMOS device of claim 1, wherein the resistor is doped with an implantation dosage selected from a range of approximately $1\times10^{14}$ to $1\times10^{15}$ ions per square centimeter.

7. The CMOS device of claim 1, wherein the resistance of the resistor is sufficient to enable a first current to flow through the resistor when a gate bias of the gate is turned on, and a second current to flow through the resistor when the gate bias of the gate is turned off, wherein the second current is lower than the first current.

8. A complementary metal-oxide semiconductor (CMOS) device comprising:
   a first semiconductor well disposed on a first insulator, the first semiconductor well having a first doping type;
   a second insulator disposed on the first semiconductor well;
   a gate disposed on the first semiconductor well; and
   a resistor disposed on an edge of the first semiconductor well, adjacent to the second insulator and in contact with the gate, the resistor having a second doping type opposite the first doping type,
   wherein the resistance of the resistor varies proportionally to a current through the resistor.

9. The CMOS device of claim 1, further comprising a second semiconductor well disposed on the buried insulator, wherein the second semiconductor well has opposite doping as the first semiconductor well.

10. The CMOS device of claim 1, wherein the first insulator is a buried insulator layer.

11. The CMOS device of claim 1, wherein the second insulator is a Shallow Trench Isolation (STI) insulator.

12. The CMOS device of claim 1, wherein the resistance of the resistor varies proportionally to a source-to-drain voltage across the source and the drain of the CMOS device.

13. The CMOS device of claim 1, wherein a source-to-drain voltage across the source and the drain of the of the CMOS device induces a depletion region that enables conduction through the resistor.

14. A method comprising:
   implanting a dopant into a doped semiconductor well covered by a barrier, wherein the doped semiconductor well is disposed on a buried first insulator and wherein the dopant is of opposite doping type to the doped semiconductor well, thereby forming a first semiconductor well disposed on a first insulator, the first semiconductor well having a first doping type, and forming a resistor on an edge of the doped semiconductor well, wherein the resistor has the opposite doping type;
   forming a second insulator disposed on the first semiconductor well and adjacent to the resistor;
   removing the barrier; and
   forming a gate layer on the doped semiconductor well, thereby forming a gate disposed on the doped semiconductor well and adjacent to the doped semiconductor well and the resistor,
   whereby the resistor is disposed on an edge of the doped semiconductor well, adjacent to the second insulator and in contact with the gate, the resistor having a second doping type opposite the first doping type, and
   wherein the resistor enables a current to flow through a source and a drain of the CMOS device through the resistor.

15. The method of claim 14, wherein implanting the dopant into the doped semiconductor well comprises implanting the dopant at a selected implantation dosage and a selected energy of implantation to provide a resistance sufficient to enable a current to flow through the resistor.

16. The method of claim 15, wherein implanting the dopant into the doped semiconductor well further comprises implanting the dopant at the selected implantation dosage and the selected energy of implantation such that the resistance is sufficient to enable a first current to flow through the resistor when a gate bias of the gate is turned on, and a second current to flow through the resistor when the gate bias of the gate is turned off, where the second current is lower than the first current.

17. The method of claim 15, wherein the selected energy of implantation is selected from a range of approximately 10 kilo-electronvolts (keV) to 100 keV.

18. The method of claim 14, wherein the doped semiconductor well comprises an n-type well doped with phosphorus, and the dopant implanted to form the resistor comprises a p-type dopant, wherein the p-type dopant comprises boron, the method further comprising:
  forming a source and a drain self-aligned to the gate layer, such that the resistor on the edge of the doped semiconductor well provides a conductive path between the source and the drain.

19. The method of claim 14, wherein the doped semiconductor well comprises a first doped semiconductor well, the method further comprising:
  forming the first doped semiconductor well and a second doped semiconductor well having the opposite doping type to the first doped semiconductor well in a Shallow Trench Isolation (STI) partially depleted silicon on insulator (SOI) process, prior to implanting the dopant.

20. The method of claim 14, wherein implanting the dopant into the doped semiconductor well comprises implanting the dopant in a quad mode implantation process.

* * * * *

UNITED STATES PATENT AND TRADEMARK OFFICE
CERTIFICATE OF CORRECTION

PATENT NO. : 9,773,808 B2
APPLICATION NO. : 14/705778
DATED : September 26, 2017
INVENTOR(S) : Paul S. Fechner Page 1 of 1

It is certified that error appears in the above-identified patent and that said Letters Patent is hereby corrected as shown below:

On the Title Page

Item [57] Line 15, delete, "..forming agate layer.." and insert, --..forming a gate layer..--

Signed and Sealed this
Seventeenth Day of April, 2018

Andrei Iancu
*Director of the United States Patent and Trademark Office*